United States Patent
Chen et al.

(10) Patent No.: US 8,592,793 B2
(45) Date of Patent: Nov. 26, 2013

(54) ELECTRODE DIFFUSIONS IN TWO-TERMINAL NON-VOLATILE MEMORY DEVICES

(75) Inventors: Xiying Chen, San Jose, CA (US); Huiwen Xu, Sunnyvale, CA (US); Chuanbin Pan, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 176 days.

(21) Appl. No.: 13/100,657

(22) Filed: May 4, 2011

(65) Prior Publication Data

US 2011/0204313 A1    Aug. 25, 2011

Related U.S. Application Data (62) Division of application No. 12/458,091, filed on Jun. 30, 2009, now Pat. No. 7,955,981.

(51) Int. Cl.
*H01L 47/00* (2006.01)

(52) U.S. Cl.
USPC ............ 257/4; 257/5; 257/183; 257/E45.002; 438/385; 438/268; 438/270; 438/478

(58) Field of Classification Search
USPC .................. 257/4–5, 183, 324, 522, E45.002; 438/385, 268, 270, 478, 585
See application file for complete search history.

(56) References Cited

U.S. PATENT DOCUMENTS

| | | | |
|---|---|---|---|
| 6,586,842 B1 | 7/2003 | You et al. | |
| 2003/0022420 A1 | 1/2003 | Kleveland et al. | |
| 2004/0097035 A1 | 5/2004 | Yamamukai | |
| 2005/0052915 A1 | 3/2005 | Herner et al. | |
| 2007/0040188 A1 | 2/2007 | Tsai et al. | |
| 2007/0217635 A1 | 9/2007 | Ogura et al. | |
| 2007/0228414 A1 | 10/2007 | Kumar et al. | |
| 2008/0070162 A1 | 3/2008 | Ufert | |
| 2008/0099827 A1 | 5/2008 | Kreupl | |
| 2008/0217732 A1 | 9/2008 | Kreupl | |
| 2009/0230505 A1* | 9/2009 | Dennison | 257/522 |

FOREIGN PATENT DOCUMENTS

WO    2004/061851 A2    7/2004

OTHER PUBLICATIONS

International Searching Authority/European Patent Office (ISA/EP). International Search Report and Written Opinion, International Application PCT/US10/38130. Nov. 8, 2010, 14 pages.
International Preliminary Report on Patentability issued in PCT Application PCT/US2010/038130, mailed on Jan. 12, 2012.

* cited by examiner

*Primary Examiner* — Mark A Laurenzi
(74) *Attorney, Agent, or Firm* — The Marbury Law Group PLLC (57) ABSTRACT

A non-volatile memory device includes a plurality of pillars, where each of the plurality of pillars contains a non-volatile memory cell containing a steering element and a storage element and at least one of a top corner or a bottom corner of each of the plurality of pillars is rounded. A method of making non-volatile memory device includes forming a stack of device layers, and patterning the stack to form a plurality of pillars, where each of the plurality of pillars contains a non-volatile memory cell that contains a steering element and a storage element, and where at least one of top corner or bottom corner of each of the plurality of pillars is rounded.

19 Claims, 9 Drawing Sheets

ELECTRODE DIFFUSIONS IN TWO-TERMINAL NON-VOLATILE MEMORY DEVICES

The present application is a divisional of U.S. application Ser. No. 12/458,091, filed on Jun. 30, 2009, which is incorporated herein by reference in its entirety.

FIELD OF THE INVENTION

The present invention relates generally to the field of semiconductor devices and processing, and specifically to a non-volatile memory device and a method of making the same.

BACKGROUND

Herner et al., U.S. patent application Ser. No. 10/955,549 filed Sep. 29, 2004 (which corresponds to US Published Application 2005/0052915 A1), hereby incorporated by reference, describes a three dimensional memory array in which the data state of a memory cell is stored in the resistivity state of the storage material.

SUMMARY

One embodiment of this invention provides a non-volatile memory device, comprising a plurality of pillars, where each of the plurality of pillars comprises a non-volatile memory cell comprising a steering element and a storage element and where at least one of a top corner or a bottom corner of each of the plurality of pillars is rounded.

Another embodiment of this invention provides a method of making non-volatile memory device, comprising forming a stack of device layers, and patterning the stack to form a plurality of pillars, where at least one of top corner or bottom corner of each of the plurality of pillars is rounded and where each of the plurality of pillars comprises a non-volatile memory cell comprising a steering element and a storage element.

DETAILED DESCRIPTION OF THE PREFERRED EMBODIMENTS

A conventional non-volatile memory device may comprise a plurality of pillars, each of which comprises a pillar-shaped memory cell, the side cross-sectional view of which is approximately a rectangle. In other words, the pillars may have sharp top and bottom corners (i.e., corners having an about 90 degrees angle and less than 5 nm radius). Such sharp corners may result in several problems. For example, the stress induced defects due to the sharp corners may have negative impact on process steps including liner growth and/or oxide densification. The sharp corners may also induce electric field crowding, resulting in diffusion of the material of adhesion layer into the device layer (of the memory cell) that is located adjacent to the adhesion layer.

One embodiment of this invention provides a non-volatile memory device, comprising a plurality of pillars, where each of the plurality of pillars comprises a non-volatile memory cell comprising a steering element and a storage element. At least one of a top corner or a bottom corner of each of the plurality of pillars is rounded. The non-volatile memory device may comprise a one-time programmable (OTP) or re-writable non-volatile memory device.

In some embodiments, the top corner of each of the plurality of pillars is rounded and has a radius of about 5 to about 500 nm, for example about 30 to about 100 nm. In some embodiments, the bottom corner of each of the plurality of pillars is rounded and has a radius of about 5 to about 500 nm, for example about 30 to about 100 nm. In some other embodiments, both of the top corner and the bottom corner of each of the plurality of pillars are rounded having a radius of about 5 to about 500 nm. The radius of the top corner and the bottom corner may be same or different. In other words, for a cylindrical pillar, the corner of the pillar when viewed from the side (rather than from top or bottom) is rounded.

Figure 1A:
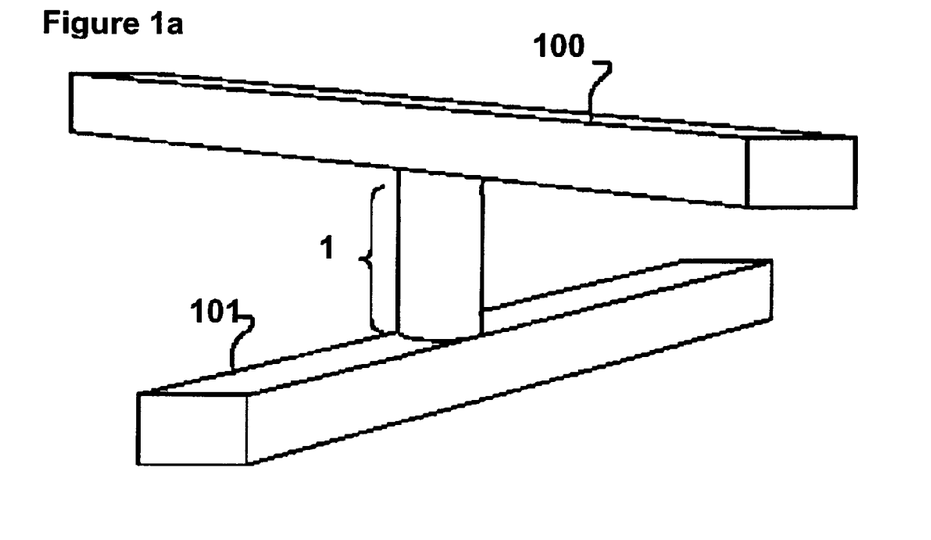
FIG. 1a is a three dimensional view of a non-volatile memory device according to an embodiment of the present invention.

As a non-limiting example, FIG. 1a illustrates a perspective view of a memory cell formed according to one embodiment of the present invention. A pillar 1 comprising a non-volatile memory cell is located between a corresponding bottom electrode 101 and a corresponding top electrode 100. The bottom electrode 101 extends in a first direction and the top electrode 100 extends in a second direction different from the first direction. The bottom and top electrodes 100 may be formed of any suitable conductive materials, such as tungsten, aluminum, copper, tungsten nitride, titanium nitride, or a combination thereof.

Figure 1B:
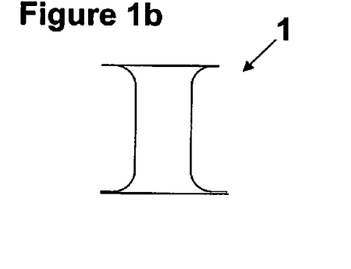
FIGS. 1b-1e illustrate side cross-sectional views of the pillar (referred to as pillar 1 in FIG. 1a) according to different embodiments, respectively.
Figure 1C:
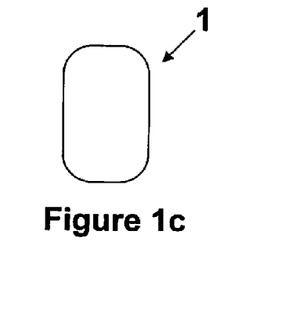

In some embodiments, the top corner of each of the plurality of pillars forms a concave or convex angle which differs by at least 10 degrees from 90 degrees with a bottom surface of the top electrode 100, and the bottom corner of each of the plurality of pillars forms a concave or convex angle which differs by at least 10 degrees from 90 degrees with an upper surface of the bottom electrode 101, having cross-sectional side views as shown in FIG. 1b (concave angles) or FIG. 1c (convex angles). Alternatively, only one of the top corner or the bottom corner of the pillars forms such a concave or convex angle, while the other one of the top corner or the bottom corner still forms a conventional about 90 degrees angle with the surface of the corresponding electrode, for example but not limited to the structures shown in FIGS. 1d and 1e.

Figure 1D:
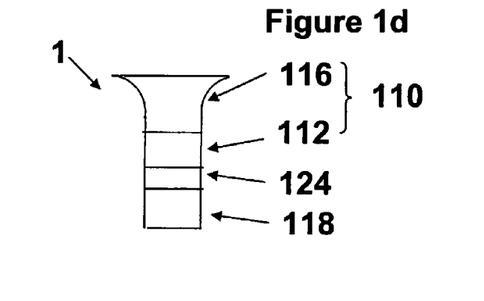
Figure 1E:
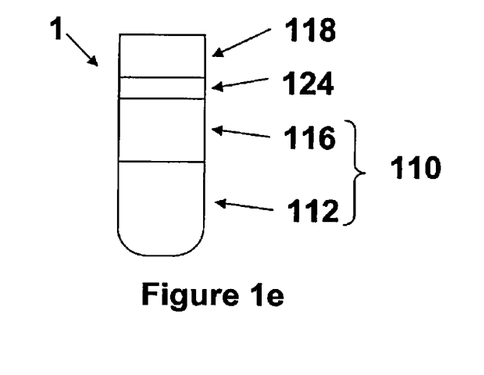

The pillar 1 may comprise a steering element 110 and a storage element 118 located below the steering element 110 as shown in FIG. 1d. Alternatively, the storage element 118 may be located over the steering element 110 as shown in FIG. 1e instead, rather than below the steering element 110.

Optionally, an adhesion layer 124 may be deposited between the storage element 118 and the steering element 110 of the pillar 1. For simplicity, not all combinations of corner rounding and material stacking are shown in FIGS. 1b-1e, but it will be understood that the skilled practitioner may select other combinations instead. The rounded corner may be located in the steering element 110 or the storage element 118 or in both.

The steering element 110 may comprise a diode. For example, the steering element may comprise a semiconductor diode having a first conductivity type region 112 (e.g., n-type) and a second conductivity type region 116 (e.g., p-type) located over the first conductivity type region 112, as shown in FIGS. 1d and 1e. The steering element 110 may further comprises an optional intrinsic region (not shown), which is not intentionally doped and is located between the first conductivity type region 112 and the second conductivity type region 116. The diode 110 may comprise any single crystal, polycrystalline, or amorphous semiconductor material, such as silicon, germanium, or silicon-germanium alloys.

The storage element 118 may comprise any suitable storage materials, for example, resistivity switching materials such as an antifuse, fuse, metal oxide memory, switchable complex metal oxide, carbon nanotube memory, graphene resistivity switchable material, carbon resistivity switchable material, phase change material memory, conductive bridge element, or switchable polymer memory. In one embodiment, the storage element 118 comprises a carbon resistivity switchable material. For example, the storage element 118 may comprise at least one of carbon nanotube (single walled, multi-walled, or a mixture of single and multi-walled nanotubes), amorphous carbon, polycrystalline carbon, graphene resistivity switching material, or a combination thereof. For example, in some embodiments, the carbon material comprises a polycrystalline carbon, amorphous carbon, or a combination of polycrystalline carbon and amorphous carbon. The resistivity of the carbon resistivity switching layer may be permanently increased or decreased in response to a forward and/or reverse bias provided between the electrodes 101 and 100.

The adhesion layer 124 may be formed of any suitable materials, for example, transition metals, metal silicide, metal nitride, such as titanium, titanium silicide, titanium nitride, tungsten silicide, tungsten nitride, nickel silicide, or nickel nitride. For example, in one embodiment, the adhesion layers comprise titanium nitride.

In some embodiments, a liner (not shown) may be deposited over the side wall of each of the plurality of pillars. The liner may comprise any suitable insulating materials. For example, in one embodiment, the liner comprises silicon nitride.

Optionally, the non-volatile memory device may further comprise one or more adhesion layers (not shown), for example, a first adhesion layer deposited between the pillar 1 and the bottom electrode 101 and a second adhesion layer located between the pillar 1 and the top electrode 100. The adhesion layers may be independently selected from any suitable materials, same or different from the material(s) comprised of the adhesion layer 124.

The non-volatile memory device may be fabricated by any suitable methods including the non-limiting embodiments described below.

Figure 2A:
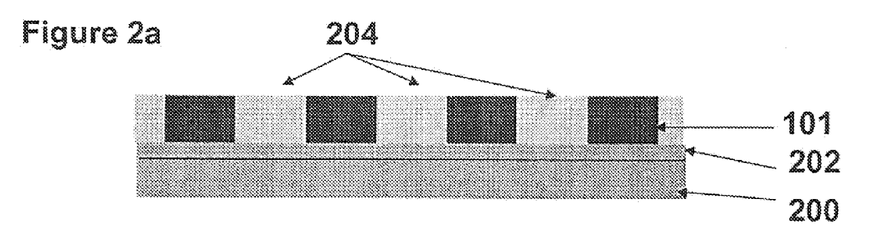
FIGS. 2a to 2c are side cross-sectional views illustrating stages in formation of a non-volatile memory device according to an embodiment of the present invention.

Referring to FIG. 2a, the non-volatile device may be formed over a substrate 200. The substrate 200 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as glass, plastic, metal or ceramic substrate. The substrate may include integrated circuits fabricated thereon, such as driver circuits for a memory device. An insulating layer 202 is preferably formed over substrate 200. The insulating layer 202 can be silicon oxide, silicon nitride, high-dielectric constant film, Si—C—O—H film, or any other suitable insulating material.

A bottom electrode 101 is formed over the substrate 200 and insulating layer 202. The bottom electrode 101 has a rail shape. Any conducting materials known in the art, such as tungsten and/or other materials, including aluminum, tantalum, titanium, copper, cobalt, or alloys thereof, may be used. In some embodiments, the bottom electrode 101 may further comprise a first adhesion layer, such as a TiN layer, located on top of the conducting material.

Finally, an insulating layer 204 is deposited between electrodes 101. The insulating layer 204 can be any suitable electrically insulating materials, such as silicon oxide, silicon nitride, or silicon oxynitride. The insulating layer 204 may be deposited and then planarized by CMP for a desired amount of time to obtain a planar surface.

Alternatively, the electrodes 101 may instead be formed by a Damascene method, in which the conductive material(s) of the electrodes 101 is formed in grooves in an insulating layer followed by a subsequent planarization.

Figure 2B:
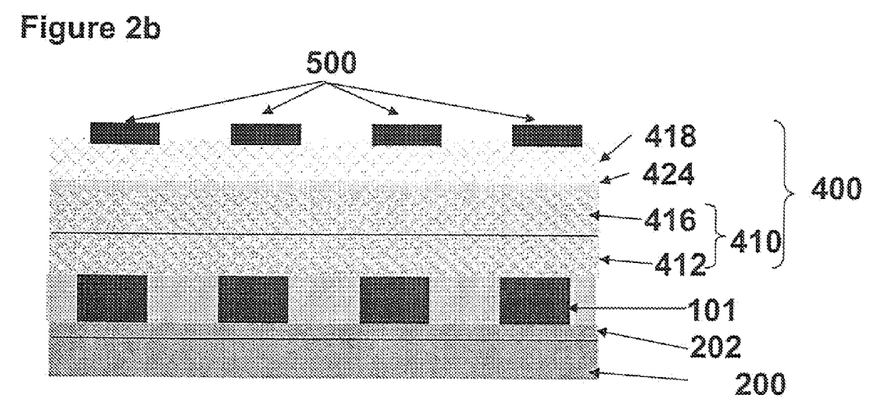

Next, turning to FIG. 2b, a stack 400 of device layers may be deposited over the electrodes 101 and the insulating layer 204. The stack 400 comprises at least a semiconductor layer 410 and a storage material layer 418 over the semiconductor layer 410. Optionally, an adhesion layer 424 may be deposited between the semiconductor 410 and the storage material layer 418. The semiconductor layer 410 comprises at least a first conductivity type semiconductor sub-layer 412 and a second conductivity type sub-layer 416 located over the first conductivity type semiconductor sub-layer 412, and optionally an intrinsic sub-layer (not shown) deposited between the first conductivity type sub-layer and the second conductivity type sub-layer. In some embodiments, the first conductivity type may be n-type while the second conductivity type is p-type accordingly. Alternatively, the first conductivity type may be p-type while the second conductivity type is n-type accordingly.

In an alternative embodiment, the storage material layer 418 may be located below the semiconductor layer 410, rather than over the semiconductor layer 410.

Finally, a hard mask layer may be formed over the stack 400 and patterned to form mask features 500 shown in FIG. 2b. The mask features are pillar-shaped, and form a pattern having about the same pitch and about the same width as the electrodes 101 below.

Figure 2C:
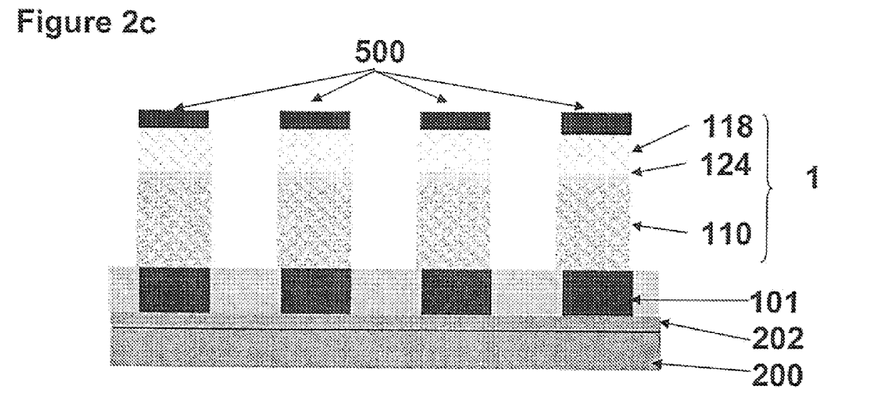

The stack 400 of device layers can then be patterned using the mask features 500 as a mask, resulting in a structure shown in FIG. 2c, comprising pillars 1 formed on top of a respective electrode 101. Some misalignment can be tolerated.

The top and/or bottom corners of the pillar 1 may be rounded by any suitable methods including the non-limiting embodiments described below.

Figure 3A:
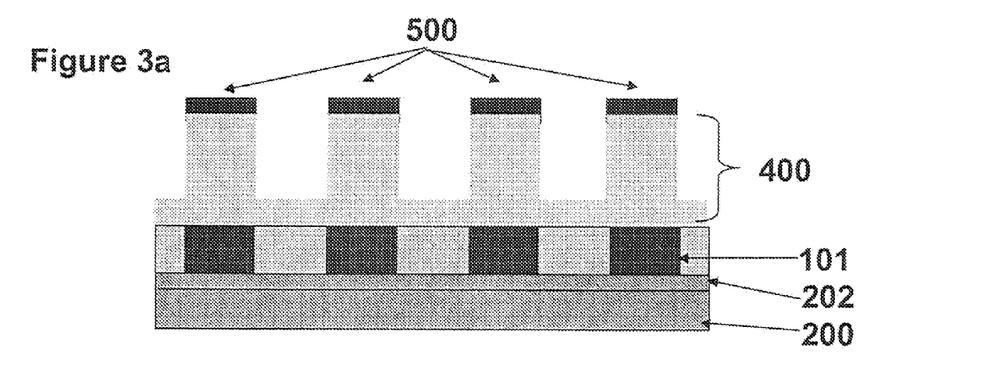
FIGS. 3a and 3b are side cross-sectional views illustrating stages in formation of a non-volatile memory device according to a first embodiment of the present invention.
Figure 3B:
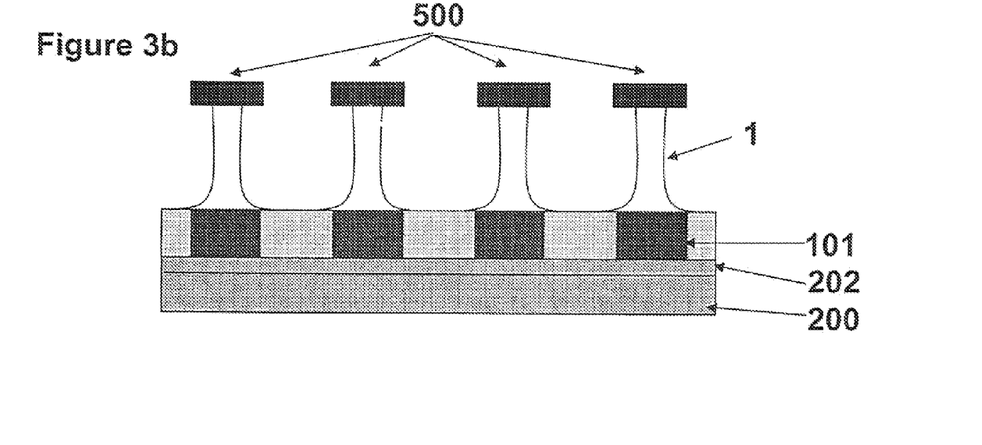

Referring to FIG. 3a, in a first embodiment, the step of patterning the stack 400 comprises anisotropically etching at least an upper portion of the stack 400. A step of isotropically etching at least a lower portion of the stack 400 can then be conducted to round the bottom corner of the pillars such that the bottom corner of each pillar have a radius of about 5 to about 500 nm and a concave angle which differs by at least 10 degrees from 90 degrees with an upper surface of the bottom electrode, resulting in a structure shown in FIG. 3b.

Figure 3C:
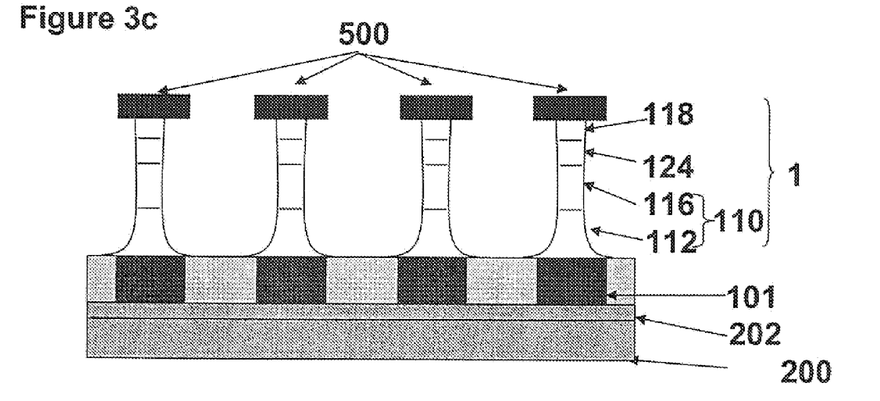
FIGS. 3c and 3d are side cross-sectional views illustrating structures according to the first embodiment of the present invention.
Figure 3D:
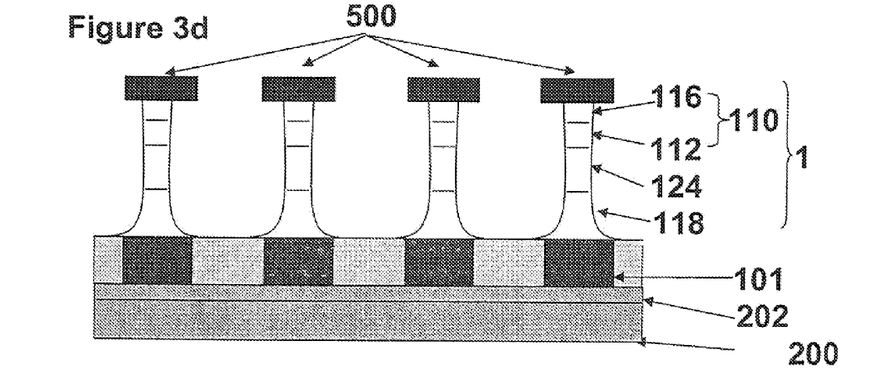

Specifically, when the stack of device layers comprises the storage material layer 418 located over the semiconductor layer 410 (e.g., as shown in FIG. 2b), the step of isotropically etching the lower portion of the stack comprises isotropically etching at least part of the first conductivity type semiconductor sub-layer 412, resulting in a structure shown in FIG. 3c. Alternatively, when the stack of device layers comprises the storage material layer located below the semiconductor layer, the step of isotropically etching the lower portion of the stack comprises isotropically etching at least part of the storage material layer, resulting in a structure shown in FIG. 3d.

Figure 4A:
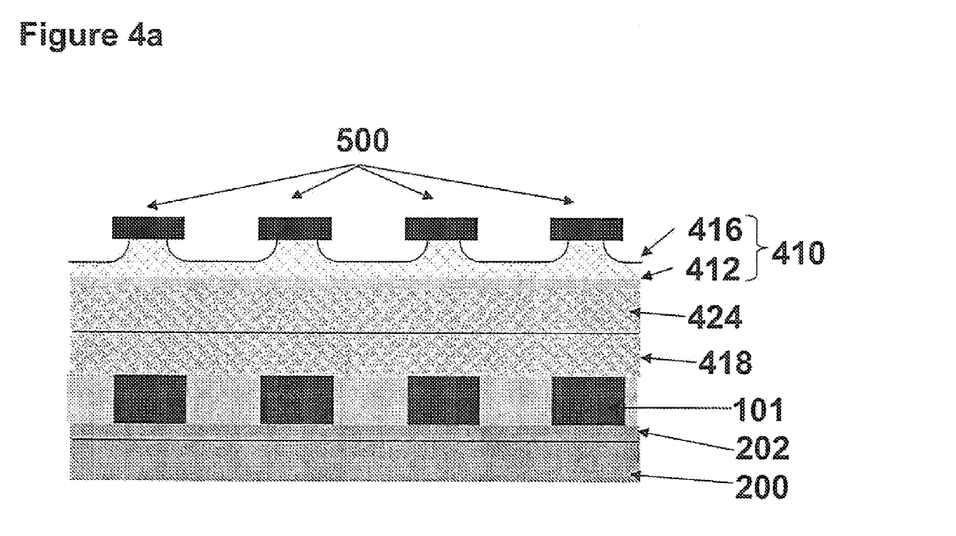
FIGS. 4a and 4b are side cross-sectional views illustrating stages in formation of a non-volatile memory device according to a second embodiment of the present invention.
Figure 4B:
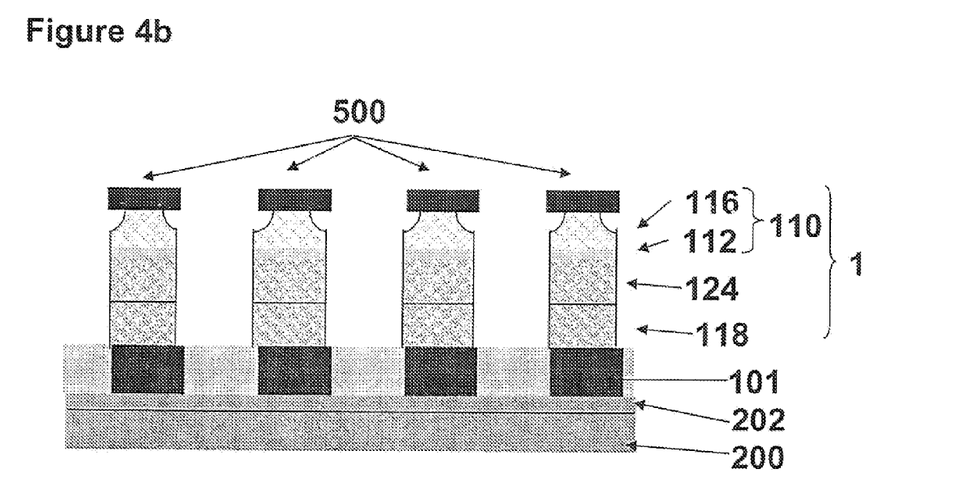

In a second embodiment, the step of etching the stack of device layers comprises a step of undercutting an upper portion of the stack below the mask, followed by a step of anisotropically etching the whole stack. In some embodiments, the step of undercutting an upper portion of the stack below the mask comprises isotropically etching an upper portion of the stack, resulting in a structure as shown in FIG. 4a. The undercut stack may then be anisotropically etched to form pillars 1, as shown in FIG. 4b. The etching parameters can be tuned to round the top corner of the resulting pillars to have a radius of about 5 to about 500 nm and a concave angle which differs by at least 10 degrees from 90 degrees with a bottom surface of the top electrode, resulting in a structure as shown in FIG. 4b.

When the stack of device layers comprises the storage material layer located over the semiconductor layer, the step of undercutting the upper portion of the pillars comprises undercutting an upper portion of the storage material layer 118 underneath the mask features to round the top corner of the plurality of pillars. For example, when the storage material layer 118 is a carbon storage layer, an carbon isotropic etching may be conducted to undercut an upper portion of the carbon layer, prior to the anisotropic etching of the lower portion of the stack including an lower portion of the carbon layer.

Alternatively, when the stack of device layers comprises the storage material layer located below the semiconductor layer, the step of undercutting the upper portion of the pillars comprises undercutting an upper portion of the semiconductor layer (at least an upper portion of the second conductivity type semiconductor sub-layer located over the first conductivity type semiconductor sub-layer) underneath the mask features to round the top corner of the plurality of pillars. For example, when the semiconductor layer comprises polysilicon, a polysilicon isotropic etching may be conducted to undercut an upper portion of the semiconductor layer, prior to the anisotropic etching of the lower portion of the stack including an lower portion of the semiconductor layer.

Figure 5A:
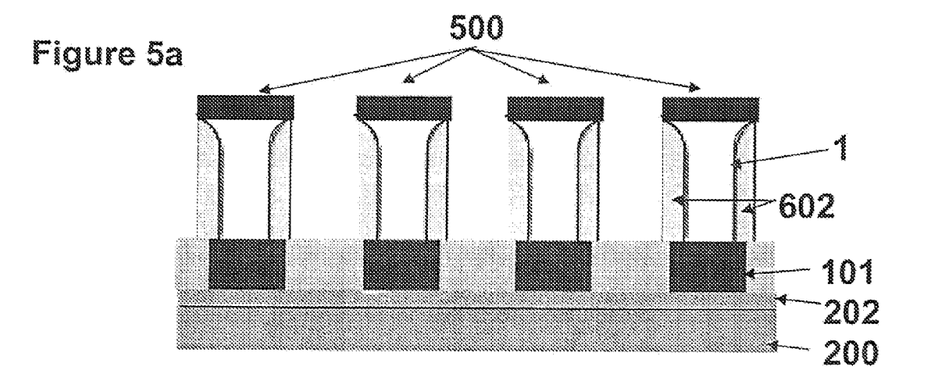
FIGS. 5a and 5b are a side cross-sectional views illustrating structures of pillar devices of a third embodiment of the present invention.
Figure 5B:
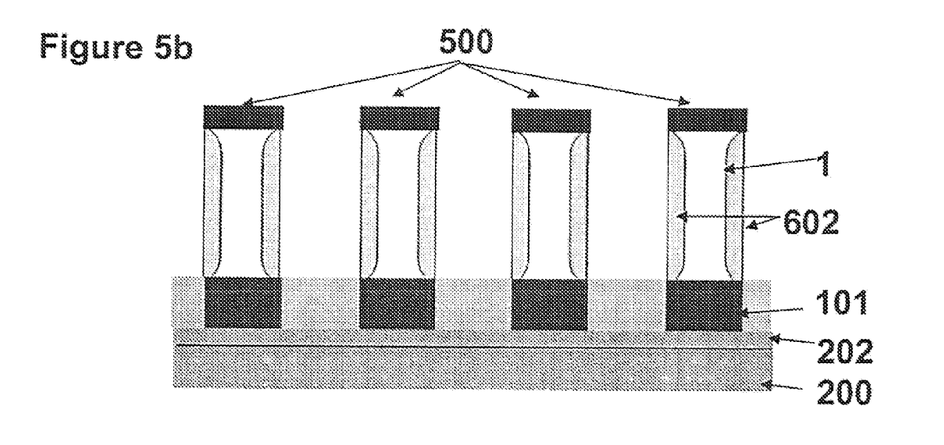

In a third embodiment, a step of nitriding the side wall of the pillar, which converts the side wall of the pillar to a nitride material, may be conducted. For example, a silicon side wall can be converted to silicon nitride when exposed to a nitrogen containing ambient, such as ammonia or nitrogen gas or plasma, at an elevated temperature. The upper portion of the side wall may have a lower nitriding rate than a middle portion of the side wall, due to a lower diffusion rate of reactive gas to the region adjacent to the mask features, forming a nitride structure 602 as illustrated in FIG. 5a. Thus, the top corner of the pillars 1 may be rounded to have a radius of about 5 to about 500 nm and a concave angle which differs by at least 10 degrees from 90 degrees with a bottom surface of the top electrode. Similarly, if the reactive gas diffuses at a lower rate to the region adjacent to the bottom electrode, the bottom corner of the pillar may also be rounded to have a radius of about 5 to about 500 nm and a concave angle which differs by at least 10 degrees from 90 degrees with an upper surface of the bottom electrode. In some embodiments, both the top corner and the bottom corner may be rounded simultaneously during the step of nitriding the side wall of the pillar 1 to form the nitride layer 602, as shown in FIG. 5b. The radius of the top and bottom corners may be same or different.

Figure 6A:
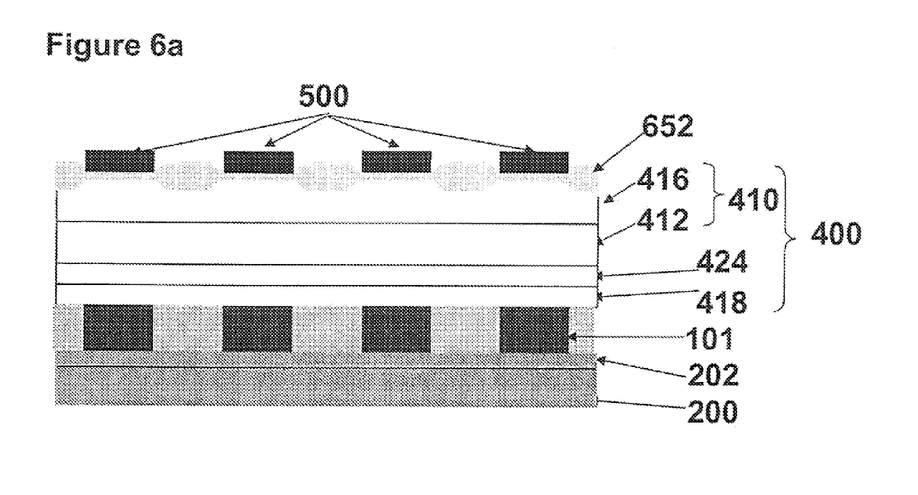
FIGS. 6a and 6b side cross-sectional views illustrating stages in formation of a non-volatile memory device according to a fourth embodiment of the present invention.
Figure 6B:
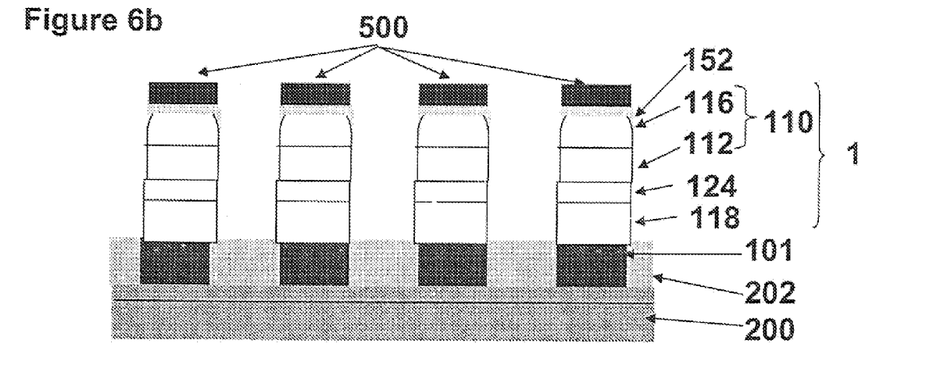

In a fourth embodiment, an upper portion of the stack 400 may be partially nitrided using the mask features 500 as a mask (i.e., forming nitride features 652 having a bird's beak shape, as shown in FIG. 6a), prior to the step of etching the stack 400. This process is similar to the LOCOS process, except that a silicon nitride rather than a silicon oxide insulating features 652 are preferably formed and the insulating features 652 are not used to electrically isolate adjacent devices. After the step of anisotropic etching the underlying layers using features 500 as a mask to form the pillars 1, portions of the silicon nitride bird's beak features 652 located below the mask features 500 remain in the pillars 1, resulting in nitride features 152, and the top corner of the resulting pillars 1 is rounded, as shown in FIG. 6b. In some embodiments, when the stack 400 comprises the storage material layer 418 located underneath the semiconductor layer 410, the step of nitriding the upper portion of the stack 400 comprises nitriding an upper portion of the second conductivity type semiconductor sub-layer 416 (i.e., converts the upper portion of the second conductivity type semiconductor sub-layer 416 in the stack 400 to a nitride material). This results in a rounding of the top corner of the second conductivity type semiconductor sub-layer 116 in the pillar 1 to have a radius of about 5 to about 500 nm and a convex angle which differs by at least 10 degrees from 90 degrees with an bottom surface of the top electrode.

Figure 7A:
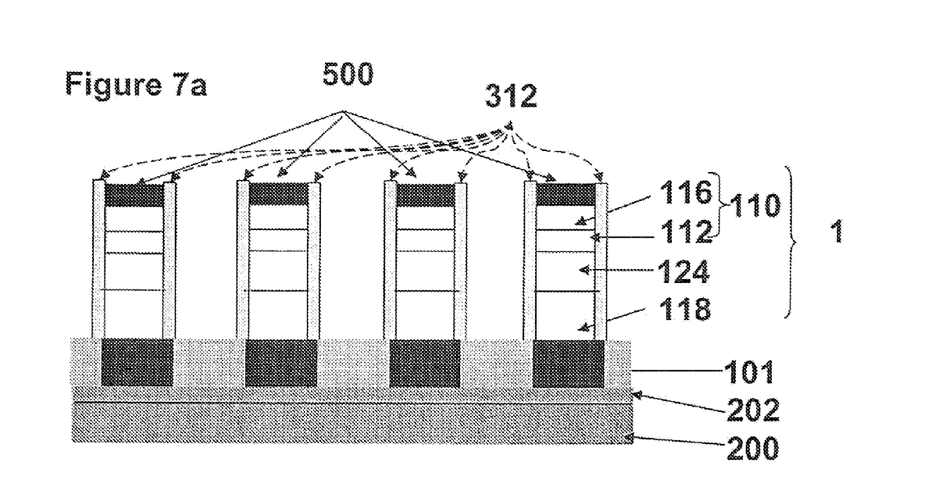
FIGS. 7a to 7d are side cross-sectional views illustrating stages in formation of a non-volatile memory device according to a fifth embodiment of the present invention.

Optionally, a liner 312 can then be formed over the side wall of the plurality of pillars 1, as shown in FIG. 7a. The liner can comprise any suitable insulating material, such as silicon nitride. In some embodiments, the liner can be deposited by thermal chemical vapor deposition (CVD). For example, the step of forming the liner may comprise thermal chemical vapor depositing silicon nitride at a temperature of 600° C. to 900° C., which may further round at least one of the top corner and the bottom corner of the pillars 1. If desired, an optional high temperature thermal annealing may be conducted at a temperature higher than around 700° C., such as 700° C. to 1000° C., to further round the at least one of the top corner and the bottom corner of the plurality of pillars 1, prior to or after the step of forming the liner 312. The above steps of forming the liner 312 over the side wall of the plurality of pillars 1 and high temperature thermal annealing may be used in addition to any embodiments of this invention to further round the top and/or bottom corners of the pillars 1.

Figure 7B:
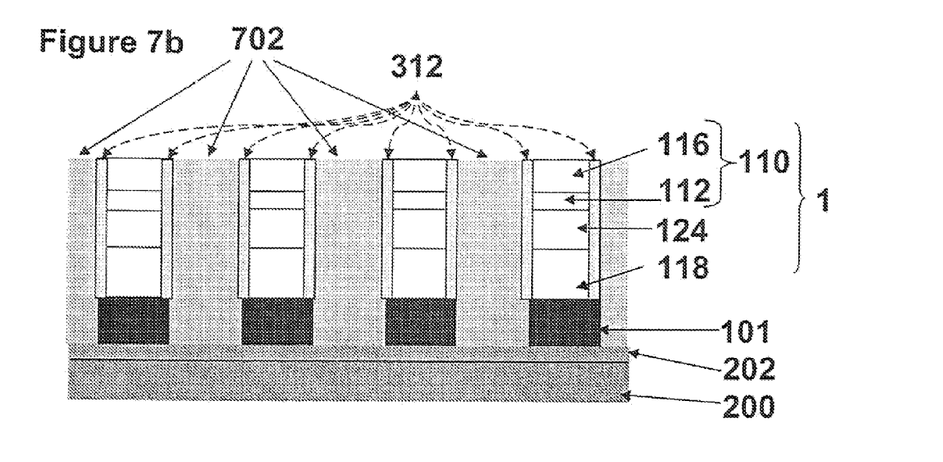

Next, an insulating filling material 702 can then be formed between and over the pillars, followed by a step of planarizing (e.g., chemical mechanical polishing (CMP)) the insulating filling material 702 using an upper surface of the pillars 1 as a stop, resulting in a structure as shown in FIG. 7b.

Finally, the top electrodes 100 having a rail shape can then be formed over the pillars 1 and the insulating filling material. The top electrode 100 extend in a second direction different from the first direction in which the bottom electrode 101 extend, resulting in a device having a three dimensional view shown in FIG. 1a.

Figure 7C:
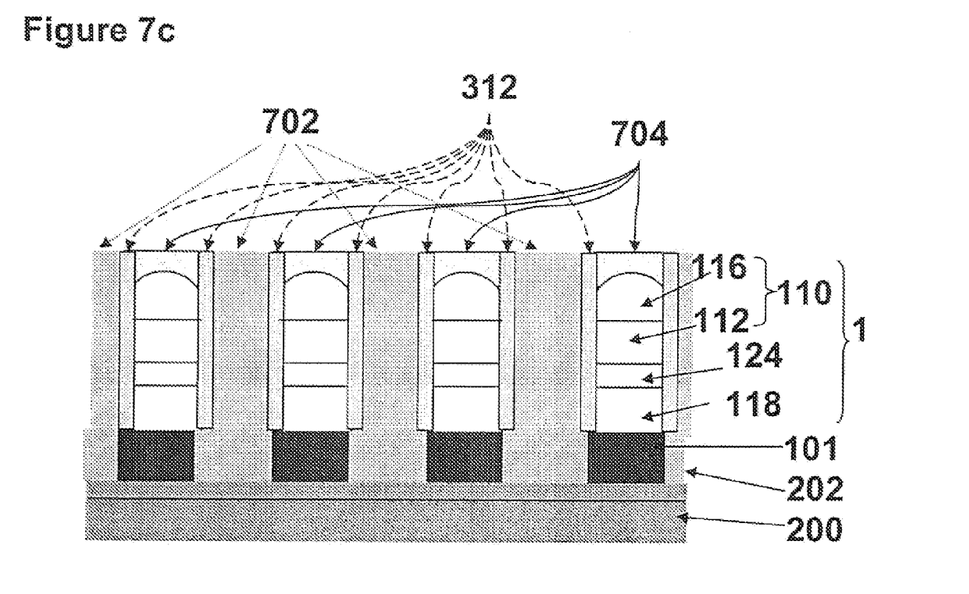
Figure 7D:
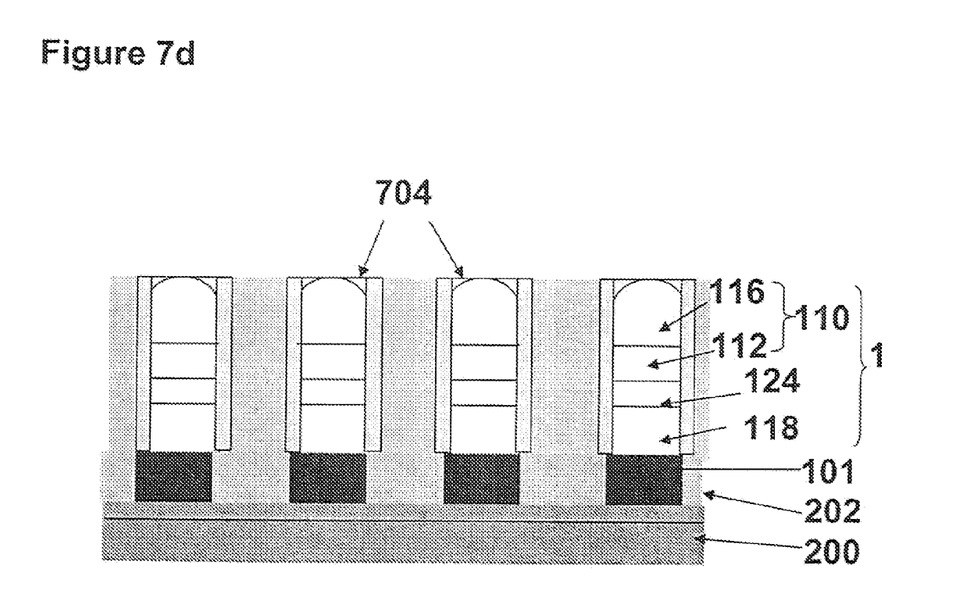

In a fifth embodiment, prior to the step of forming the top electrodes, and after the step of planarizing the insulating filling material 702, an upper portion of the pillars 1 may be converted to a nitride 704 (e.g., to silicon nitride) by nitriding an upper portion of the pillars 1 to round the top corner of the pillars, resulting in a structure illustrated in FIG. 7c. The nitride 704 is thicker around the edge than the over the middle of the pillar 1 leading to a dome shaped top part of the semiconductor layer 110 of pillar 1. Finally, as shown in FIG. 7d, another planarization (i.e., CMP or etchback) may be conducted using the upper surface of the pillars 1 (e.g., an upper surface of the semiconductor layer 110) as a polish stop to remove the nitride 704 from the middle of top part of layer 110 but leaving a part of the nitride 704 around the edge of top part of layer 110 to form a rounded top part of layer 110 (i.e., to round the top of the pillar 1). Preferably, the top corner of the pillars 1 can be rounded to have a radius of about 5 to about 500 nm and a convex angle which differs by at least 10 degrees from 90 degrees with an bottom surface of the top electrode 100.

The top corner and/or the bottom corner of the pillars may be rounded by any suitable methods, for example, by any one of the above explained embodiments or any combinations thereof (the sequence of the fabrication steps may also be altered, if desired), as long as (a) the top corner of each of the plurality of pillars forms a concave or convex angle which differs by at least 10 degrees from 90 degrees with a bottom surface of the corresponding top electrode, and/or (b) the bottom corner of each of the plurality of pillars forms a concave or convex angle which differs by at least 10 degrees from 90 degrees with an upper surface of the corresponding bottom electrode.

Formation of a first memory level has been described. Additional memory levels can be formed above this first memory level to form a monolithic three dimensional memory array. In some embodiments, electrodes can be shared between memory levels, for example, the top electrodes of one memory level would serve as the bottom electrodes of the next memory level. In other embodiments, an interlevel dielectric is formed above the first memory level, its surface planarized, and construction of a second memory level begins on this planarized interlevel dielectric, with no shared electrodes. Three, four, eight, or indeed any number of memory levels can be formed above the substrate in such a multilevel array.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A non-volatile memory device, comprising:
   a bottom electrode;
   a top electrode; and
   a plurality of pillars;
   wherein:
   each of the plurality of pillars is located between a corresponding bottom electrode and a corresponding top electrode;
   each of the plurality of pillars comprises a non-volatile memory cell comprising a steering element and a storage element;
   at least one of a top corner or a bottom corner of each of the plurality of pillars is rounded; and
   at least one of the top and the bottom corner of each of the plurality of pillars forms a convex angle which differs by at least 10 degrees from 90 degrees with a respective bottom or top surface of a respective top or bottom electrode.

2. The non-volatile memory device of claim 1, wherein:
   the top corner of each of the plurality of pillars forms the convex angle which differs by at least 10 degrees from 90 degrees with the respective bottom surface of the respective top electrode; and
   the top corner of each of the plurality of pillars is rounded and has a radius of about 5 to about 500 nm.

3. The non-volatile memory device of claim 1, wherein:
   the bottom corner of each of the plurality of pillars forms the convex angle which differs by at least 10 degrees from 90 degrees with the respective top surface of the respective bottom electrode; and
   the bottom corner of each of the plurality of pillars is rounded and has a radius of about 5 to about 500 nm.

4. The non-volatile memory device of claim 1, wherein:
   both of the top corner and the bottom corner of each of the plurality of pillars are rounded;
   the top corner of each of the plurality of pillars forms the convex angle which differs by at least 10 degrees from 90 degrees with the respective bottom surface of the respective top electrode;
   the top corner of each of the plurality of pillars is rounded and has a radius of about 5 to about 500 nm;
   the bottom corner of each of the plurality of pillars forms the convex angle which differs by at least 10 degrees from 90 degrees with the respective top surface of the respective bottom electrode; and
   the bottom corner of each of the plurality of pillars is rounded and has a radius of about 5 to about 500 nm.

5. The non-volatile memory device of claim 1, further comprising a liner deposited over a side wall of each of the plurality of pillars.

6. The non-volatile memory device of claim 1, wherein:
   the steering element comprises a diode; and
   the storage element comprises a carbon layer comprising amorphous or polycrystalline carbon.

7. The non-volatile memory device of claim 6, wherein each of the plurality of pillars further comprises an adhesion layer deposited between the carbon layer and the diode.

8. The non-volatile memory device of claim 1, wherein the storage element is selected from a group consisting of antifuse, fuse, metal oxide memory, switchable complex metal oxide, carbon nanotube memory, graphene resistivity switchable material, carbon resistivity switchable material, phase change material memory, conductive bridge element, or switchable polymer memory.

9. A non-volatile memory device, comprising a plurality of pillars, wherein:
   each of the plurality of pillars comprises a non-volatile memory cell comprising a diode steering element and a storage element; and
   at least one of a top corner or a bottom corner of the diode in each of the plurality of pillars is rounded; and wherein the storage element comprises a carbon layer comprising amorphous or polycrystalline carbon and each of the plurality of pillars further comprises an adhesion layer deposited between the carbon layer and the diode.

10. A non-volatile memory device, comprising a plurality of pillars, wherein:
each of the plurality of pillars comprises a non-volatile memory cell comprising a diode steering element and a storage element; and
at least one of a top corner or a bottom corner of the diode in each of the plurality of pillars is rounded; and
wherein:
each of the plurality of pillars is located between a corresponding bottom electrode and a corresponding top electrode; and
at least a first adhesion layer is located between each of the plurality of pillars and the corresponding bottom electrode; and
at least a second adhesion layer is located between each of the plurality of pillars and the corresponding top electrode.

11. A non-volatile memory device, comprising a plurality of pillars, wherein:
each of the plurality of pillars comprises a non-volatile memory cell comprising a diode steering element and a storage element; and
at least one of a top corner or a bottom corner of the diode in each of the plurality of pillars is rounded; and
wherein:
each of the plurality of pillars is located between a corresponding bottom electrode and a corresponding top electrode; and
at least one of (a) or (b):
(a) the top corner of the diode in each of the plurality of pillars forms a concave or convex angle which differs by at least 10 degrees from 90 degrees with a bottom surface of the corresponding top electrode; or
(b) the bottom corner of the diode in each of the plurality of pillars forms a concave or convex angle which differs by at least 10 degrees from 90 degrees with an upper surface of the corresponding bottom electrode.

12. The non-volatile memory device of claim 11, wherein the storage element is selected from a group consisting of antifuse, fuse, metal oxide memory, switchable complex metal oxide, carbon nanotube memory, graphene resistivity switchable material, carbon resistivity switchable material, phase change material memory, conductive bridge element, or switchable polymer memory.

13. The non-volatile memory device of claim 11, wherein the top corner of the diode in each of the plurality of pillars forms the concave or convex angle which differs by at least 10 degrees from 90 degrees with a bottom surface of the corresponding top electrode.

14. The non-volatile memory device of claim 13, wherein the top corner of the diode in each of the plurality of pillars forms the concave angle which differs by at least 10 degrees from 90 degrees with the bottom surface of the corresponding top electrode.

15. The non-volatile memory device of claim 13, wherein the top corner of the diode in each of the plurality of pillars forms the convex angle which differs by at least 10 degrees from 90 degrees with the bottom surface of the corresponding top electrode.

16. The non-volatile memory device of claim 11, wherein the bottom corner of the diode in each of the plurality of pillars forms the concave or convex angle which differs by at least 10 degrees from 90 degrees with the upper surface of the corresponding bottom electrode.

17. The non-volatile memory device of claim 16, wherein the bottom corner of the diode in each of the plurality of pillars forms the concave angle which differs by at least 10 degrees from 90 degrees with the upper surface of the corresponding bottom electrode.

18. The non-volatile memory device of claim 16, wherein the bottom corner of the diode in each of the plurality of pillars forms the convex angle which differs by at least 10 degrees from 90 degrees with the upper surface of the corresponding bottom electrode.

19. The non-volatile memory device of claim 11, wherein the top corner of the diode in each of the plurality of pillars forms the concave or convex angle which differs by at least 10 degrees from 90 degrees with the bottom surface of the corresponding top electrode, and wherein the bottom corner of the diode in each of the plurality of pillars forms the concave or convex angle which differs by at least 10 degrees from 90 degrees with the upper surface of the corresponding bottom electrode.

* * * * *